(12) United States Patent
Huebinger

(10) Patent No.: US 9,263,384 B2
(45) Date of Patent: Feb. 16, 2016

(54) PROGRAMMABLE DEVICES AND METHODS OF MANUFACTURE THEREOF

(75) Inventor: Frank Huebinger, Poughkeepsie, NY (US)

(73) Assignee: Infineon Technologies AG, Neubiberg (DE)

( * ) Notice: Subject to any disclaimer, the term of this patent is extended or adjusted under 35 U.S.C. 154(b) by 1520 days.

(21) Appl. No.: 12/120,021

(22) Filed: May 13, 2008

(65) Prior Publication Data

US 2009/0283853 A1 Nov. 19, 2009

(51) Int. Cl.
*H01L 23/525* (2006.01)

(52) U.S. Cl.
CPC ..... *H01L 23/5256* (2013.01); *H01L 2924/0002* (2013.01)

(58) Field of Classification Search
CPC .......................... H01L 23/5256; H01L 23/5258
USPC .......... 257/499, 528–529, E21.149, E21.147, 257/E29.001, E21.602, E21.498; 438/132, 438/467
See application file for complete search history.

(56) References Cited

U.S. PATENT DOCUMENTS

| | | | | |
|---|---|---|---|---|
| 4,135,295 A | * | 1/1979 | Price | 438/601 |
| 4,796,075 A | * | 1/1989 | Whitten | 257/665 |
| 5,389,814 A | * | 2/1995 | Srikrishnan et al. | 257/529 |
| 5,412,593 A | | 5/1995 | Magel et al. | |
| 6,432,760 B1 | * | 8/2002 | Kothandaraman et al. | 438/215 |
| 6,933,591 B1 | * | 8/2005 | Sidhu et al. | 257/665 |
| 2005/0093091 A1 | * | 5/2005 | Badami et al. | 257/529 |
| 2006/0108662 A1 | * | 5/2006 | Kothandaraman et al. | 257/528 |
| 2006/0118904 A1 | * | 6/2006 | Liaw | 257/529 |
| 2007/0007621 A1 | * | 1/2007 | Omura et al. | 257/529 |
| 2007/0029576 A1 | | 2/2007 | Nowak et al. | |
| 2007/0090486 A1 | * | 4/2007 | Otsuka et al. | 257/529 |

OTHER PUBLICATIONS

International Publication No. WO 01/93331 A2. Published Dec. 6, 2001. Kothandaraman et al. International Application No. PCT/US01/15998.*

Rizzolo, R.F., et al., "IBM System z9 eFUSE Applications and Methodology," IBM J. Res. & Dev., Jan./Mar. 2007, pp. 65-75, vol. 51, No. 1/2, IBM, Armonk, NY.

* cited by examiner

*Primary Examiner* — Zandra Smith
*Assistant Examiner* — Lauren R Bell
(74) *Attorney, Agent, or Firm* — Slater & Matsil, L.L.P.

(57) ABSTRACT

Programmable devices, methods of manufacture thereof, and methods of programming devices are disclosed. In one embodiment, a programmable device includes a link and at least one first contact coupled to a first end of the link. The at least one first contact is adjacent a portion of a top surface of the link and at least one sidewall of the link. The programmable device includes at least one second contact coupled to a second end of the link. The at least one second contact is adjacent a portion of the top surface of the link and at least one sidewall of the link.

27 Claims, 6 Drawing Sheets

PROGRAMMABLE DEVICES AND METHODS OF MANUFACTURE THEREOF

TECHNICAL FIELD

The present invention relates generally to the fabrication of semiconductor devices, and more particularly to the formation of programmable devices in semiconductor devices and methods of manufacture thereof.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon, forming an integrated circuit.

Fuses are devices that are used in semiconductor devices for many applications, such as in array redundancy, electronic chip identification (EID), recording data such as performance or test parameters, and array repair, as examples. Laser fuses (l-fuses) are fuses that are programmed with a laser. The laser uses a high temperature to cause a break in a conductive material of the l-fuses, blowing the l-fuses. However, l-fuses require a relatively large amount of surface area on a semiconductor device to avoid causing damage to surrounding portions of the integrated circuit when the fuses are blown. Furthermore, a special tool is required to program or blow l-fuses, and the point in the manufacturing process flow that l-fuses may be programmed is limited to early time periods in the process flow, e.g., after wafer tests.

Electronic fuses (e-fuses) are fuses that require a smaller amount of surface area on a chip than l-fuses. E-fuses are programmed or blown by the application of a higher than usual amount of current, which causes electromigration of a portion of the e-fuse and increases the resistance. E-fuses may be blown at multiple test and application stages and have a low risk of causing damage to surrounding devices during programming.

Some e-fuse designs have reliability problems because they are required to be programmed or blown at large amounts of applied current.

What are needed in the art are improved e-fuses in semiconductor devices and methods of manufacture thereof.

SUMMARY OF THE INVENTION

These and other problems are generally solved or circumvented, and technical advantages are generally achieved, by embodiments of the present invention, which provide novel programmable devices, fuses, methods of manufacturing semiconductor devices, and methods of programming semiconductor devices.

In accordance with an embodiment of the present invention, a programmable device includes a link and at least one first contact coupled to a first end of the link. The at least one first contact is adjacent a portion of a top surface of the link and at least one sidewall of the link. The programmable device includes at least one second contact coupled to a second end of the link. The at least one second contact is adjacent a portion of the top surface of the link and at least one sidewall of the link.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
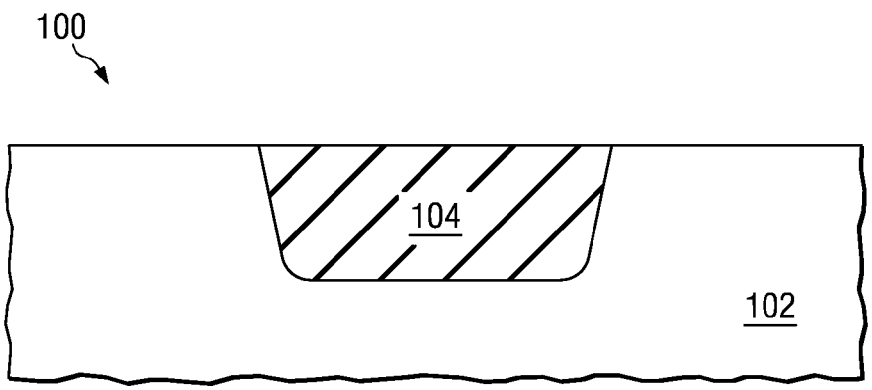
FIGS. 1 through 3 show cross-sectional views of a semiconductor device at various stages of manufacturing in accordance with an embodiment of the present invention, wherein a link of a programmable device is formed over a substrate.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely, in the formation of fuses in semiconductor devices including static random access memory (SRAM) devices. Embodiments of the present invention may also be applied, however, to semiconductor devices without SRAM devices and other types of semiconductor devices and applications that require the use of programmable devices such as fuses.

In some SRAM devices, three species or types of contacts are used to make contact from a first metallization layer of the SRAM devices to underlying material layers and active areas. A first species of contacts makes contact between the first metallization layer to a substrate or workpiece. The first species of contacts may make electrical connections to sources and drains of transistors, for example. A second species of contacts makes contact between the first metallization layer and gates of the transistors. The second species of contacts are shorter contacts than the first species of contacts, e.g., having a smaller vertical height. A third species of contacts of SRAM devices comprise rectangular contacts or CARECs (an acronym for ContAct, RECtangular), which comprise rectangular contacts that provide electrical connections between the first metallization layer and underlying regions of the SRAM devices, and also provide electrical connections between portions of the SRAM devices. The third species of contacts comprising CARECs are rectangular in a top view, and land both on the substrate or workpiece and also on gates of transistors in some applications, for example.

Embodiments of the present invention provide novel electronic fuse structures, methods of fabrication thereof, and methods of programming semiconductor devices. In accordance with one embodiment, a fuse includes a link comprising a silicide formed at a top surface thereof. At least one rectangular contact or CAREC is formed at each end of the link. A conductive line is coupled to the rectangular contacts at each end of the link. The fuses may be programmed or blown by applying a voltage across the fuses, causing a current to flow from the rectangular contact at one end of the link to the other rectangular contact at the other end of the link, e.g., using the conductive lines. The current causes a discontinuity to form in the silicide of the link, increasing the resistance of the link and programming the fuse. The novel rectangular contacts make contact to a top surface of the link, sidewalls of the link, and the substrate. At least a portion of the current may be applied from the substrate or conductive line to the at least one rectangular contact on the other side of the link during the programming process. Rectangular contacts may also be fabricated in other regions of the semiconductor device, e.g., in regions of the semiconductor device that comprise SRAM devices. Advantageously, introducing a new species of contact in the manufacturing process is avoided, because CARECs, which are common in SRAM devices, are used in the novel fuses described herein.

Figure 2:
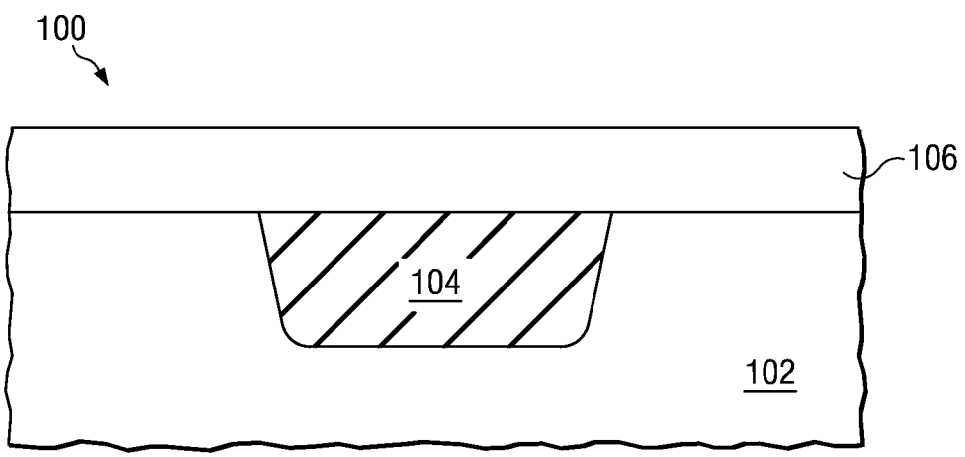
Figure 3:
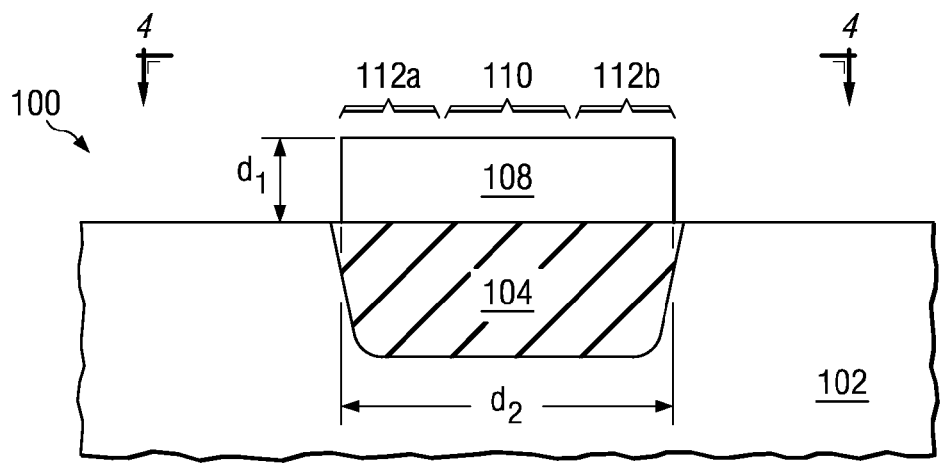

An embodiment of the present invention will next be described with reference to FIGS. 1 through 12. FIGS. 1 through 3 show cross-sectional views of a semiconductor device 100 at various stages of manufacturing in accordance with an embodiment of the present invention, wherein a link 108 of a programmable device is formed over a substrate 102. Referring first to FIG. 1, a workpiece 102 is provided. The workpiece 102 may include a semiconductor substrate, wafer, or body comprising silicon or other semiconductor materials, for example. The workpiece 102 is also referred to herein as a substrate. The substrate 102 may also include other active components or circuits, not shown. The substrate 102 may comprise single-crystal silicon, for example. The substrate 102 may include other conductive layers or other semiconductor elements, e.g., transistors, diodes, etc. Compound semiconductors, GaAs, InP, Si/Ge, or SiC, as examples, may be used in place of silicon. The substrate 102 may comprise a silicon-on-insulator (SOI) substrate or germanium-on-insulator (GOI) substrate, as examples.

Figure 4:
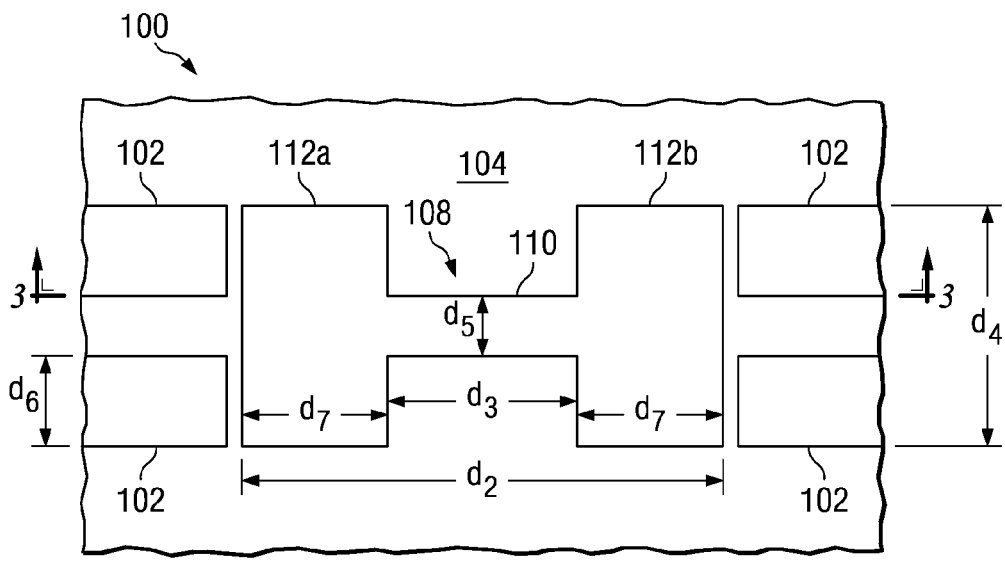
FIG. 4 shows a top view of the semiconductor device shown in FIG. 3.

An isolation region 104 is formed in the substrate 102, as shown. A plurality of isolation regions 104 may be formed across the surface of the substrate 102, for example, not shown. The isolation region 104 may be formed by depositing a layer of photosensitive material and/or hard mask material over the substrate 102 and patterning the layer of photosensitive material and/or hard mask using lithography, e.g., by exposure to energy through a lithography mask. The layer of photosensitive material is developed, and the layer of photosensitive material is used as an etch mask while portions of the optional hard mask are etched away. The layer of photosensitive material and/or hard mask is then used as an etch mask while portions of the substrate 102 are etched away. The patterned substrate 102 is then filled in with an insulating material such as an oxide, nitride, other insulating materials, or multiple layers, liners or combinations thereof, forming the isolation region 104. The isolation region 104 may comprise a pattern in a top view, as shown in FIG. 4, leaving regions of the substrate 104 in predetermined patterns. Excess portions of the insulating material may be removed from over the top surface of the substrate using an etch process and/or CMP process, for example.

The isolation regions 104 may comprise field oxide regions, shallow trench isolation (STI) regions, or thick oxide regions, for example. The isolation regions 104 may be formed using a LOCal Oxidation of Silicon (LOCOS) method or other methods, for example. The isolation regions 104 may be formed during the formation of other isolation regions of the semiconductor device 100, e.g., during the formation of STI regions for CMOS transistors, SRAM devices, or other memory, analog, or logic devices in other regions of the semiconductor device 100, not shown.

Next, a layer of material 106 is formed over the substrate 102, e.g., over a portion of the isolation region 104, as shown in the cross-sectional view of FIG. 2. The layer of material 106 may comprise about 100 nm or less of a semiconductive material such as polysilicon, amorphous silicon, or other types of semiconductor materials, as examples. The layer of material 106 may also comprise an insulator, as another example. Alternatively, the layer of material 106 may comprise other dimensions and materials, for example.

The layer of material 106 may comprise a thickness of about 80 to 100 nm in some embodiments, as an example. The layer of material 106 is patterned using lithography (e.g., as described for the patterning of the substrate 102 to form the isolation region 104), and portions of the layer of material 106 are removed, forming a link 108 comprised of the layer of material 106, as shown in FIG. 3 in a cross-sectional view. A top view of FIG. 3 at 4-4 is shown in FIG. 4. If the layer of material 106 comprises polysilicon or other semiconductive material, gates of transistors (not shown in FIG. 3; see FIG. 11 at 154) may also be formed from the layer of material 106 elsewhere on the semiconductor device 100, simultaneously with the patterning of the layer of material 106 to form the link 108.

The link 108 comprises a central region 110 and two end regions 112a and 112b. The end regions 112a and 112b are also referred to herein as a first end 112a and a second end 112b. The link 108 comprises a height comprising dimension $d_1$ that comprises substantially the thickness of the layer of material 106 as deposited, e.g., about 100 nm or less. The height or dimension $d_1$ of the link 108 is also referred to herein, e.g., in the claims, as a first height. The link 108 comprises a length or dimension $d_2$ of about 500 to 1,000 nm, although alternatively, the length of the link 108 may comprise other dimensions. The length or dimension $d_3$ of the central region 110 of the link 108, shown in the top view of FIG. 4, may comprise about 200 to 500 nm, although alternatively, dimension $d_3$ may comprise other dimensions.

The first end 112a and the second end 112b of the link 108 may comprise a width or dimension $d_4$ that may comprise about 500 nm or less in some embodiments, although alternatively, dimension $d_4$ may comprise other dimensions. It is favorable in some embodiments for dimension $d_4$ of the first end 112a and second end 112b to be as small as possible, yet large enough for one or more CARECs (e.g., first contacts 126a and second contacts 126b, respectively, shown in FIGS. 9 and 10) to land on, for example. The width or dimension $d_4$ of the first end 112a and the second end 112b is a function of the size of the CARECs and the number of CARECs used in the fuse 140 (not shown in FIG. 4; see the completed fuse 140 structure in FIG. 11 including the first contacts 126a and second contacts 126b that comprise CARECs), for example.

The link 108 comprises a width in the central region 110 comprising a dimension $d_5$, as shown in the top view of FIG. 4. Dimension $d_5$ may comprise about 50 nm or less, and in some embodiments, the width or dimension $d_5$ of the central region 110 of the link 108 may comprise a minimum feature size of the semiconductor device 100. Dimension $d_5$ may also comprise about 50 nm or greater, depending on the technology node, for example. In some embodiments, the width or dimension $d_5$ may comprise the minimum feature size or critical dimension (CD) that is manufacturable for a particular semiconductor device 100 using a particular lithography system or processes used to manufacture the semiconductor device 100, for example. Dimension $d_5$ may comprise a minimum gate width of the technology node of the semiconductor device 100, in some applications, as examples.

Figure 13:
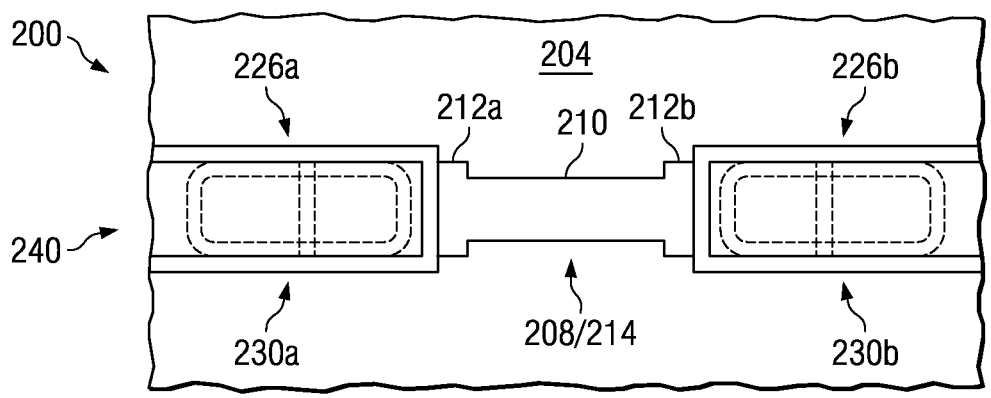
FIG. 13 shows a top view of an embodiment of the present invention, wherein the programmable device comprises one first contact and one second contact coupled to ends of a link.

The first end 112a and second end 112b may be wider than the central region 110 of the length in some embodiments, as shown, comprising a dimension $d_4$ that is greater than dimension $d_3$, to accommodate for a plurality of contacts 126a and 126b. Alternatively, the first end 112a and the second end 112b may comprise substantially the same dimension or may be slightly larger than width or dimension $d_5$ of the central region 110 of the link 108, as shown in FIG. 13 at 212a and 212b, to be described further herein.

The workpiece 102 proximate the top surface and proximate the first end 112a and second end 112b may comprise a dimension $d_6$ comprising about 100 nm or less. Dimension $d_6$ of the workpiece 102 may be defined by the isolation regions 104 formed in the workpiece 102. The workpiece 102 may also comprise substantially the same width or dimension $d_4$ of the first end 112a and second end 112b, for example, not shown. Alternatively, the workpiece 102 proximate the first end 112a and second end 112b may comprise other dimensions.

The first end 112a and second end 112b may comprise a length or dimension $d_7$ in a top view of about 500 nm or less, as an example, although alternatively, dimension $d_7$ may comprise other dimensions. The area of the first end 112a and the second end 112b may comprise a minimal amount of area, e.g., (dimension $d_4$×dimension $d_7$) may be a minimal amount for landing of the contacts 126a and 126b on the first end 112a and the second end 112b, respectively. First and second ends 112a and 112b having a minimal surface area $d_4$×$d_7$ is beneficial because providing excess silicide (not shown in FIG. 4; see silicide 114 in FIG. 5) is avoided, which may interfere with the programming of the fuse 140 and may possibly cause device failures, unintended programming results, or reliability problems, for example.

Figure 11:
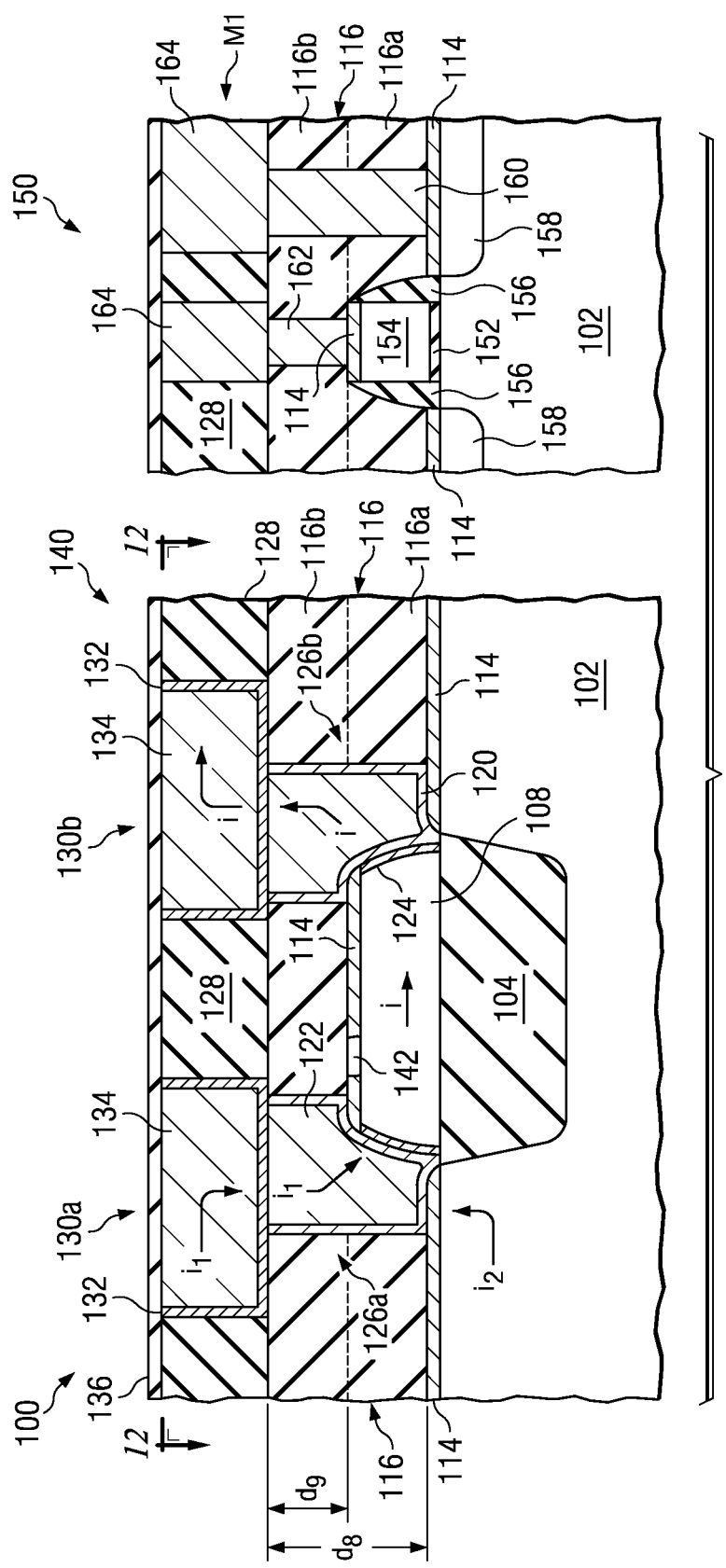
FIG. 11 shows a cross-sectional view of the semiconductor device after a first conductive line and a second conductive line are formed over the at least one first contact and the at least one second contact, respectively.
Figure 12:
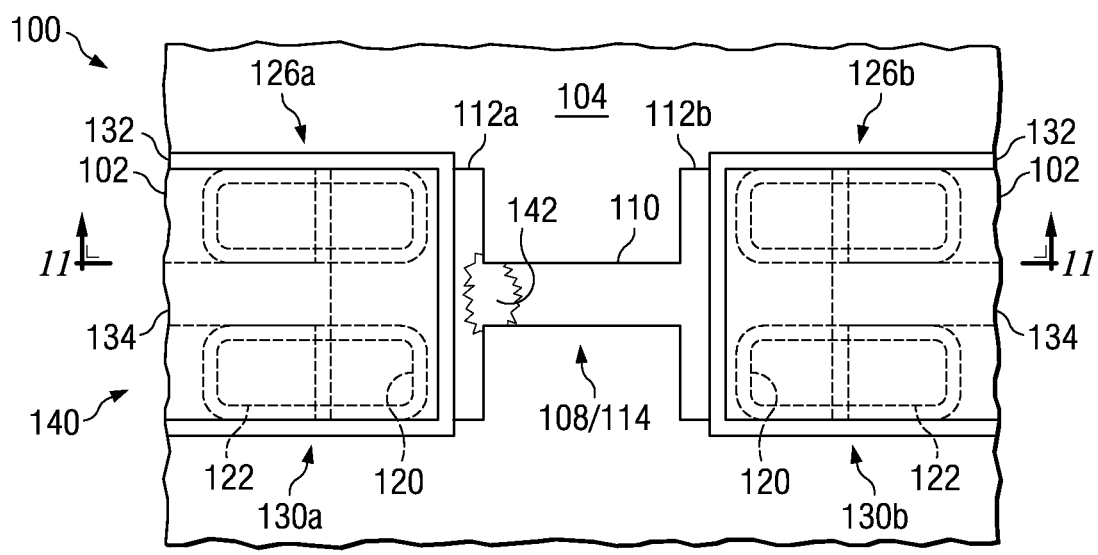
FIG. 12 shows a top view of the semiconductor device shown in FIG. 11.

Referring again to FIGS. 3 and 4, the dimensions $d_1$, $d_2$, $d_3$, $d_4$, $d_5$ and $d_7$ of the link 108 and dimension $d_6$ of the workpiece 102 may vary depending on the desired parameters for the programmable device or fuse 140, and may vary as a function of the materials used for the link 108 and the current that will be used to program and access the programmable device 140 (see FIGS. 11 and 12, which show a portion of the completed semiconductor device 100). Dimension $d_5$ may be very small in some applications for ease of programming the programmable device 140, in order to require less current to program the programmable device 140, for example.

Sidewalls of the link 108 may be substantially vertical after the etch process used to form the link 108, as shown in FIG. 3. This may be favorable in some embodiments to avoid siliciding the sidewalls of the link 108, for example. The entirety of the link 108 may be formed over the isolation region 104, as shown.

Figure 5:
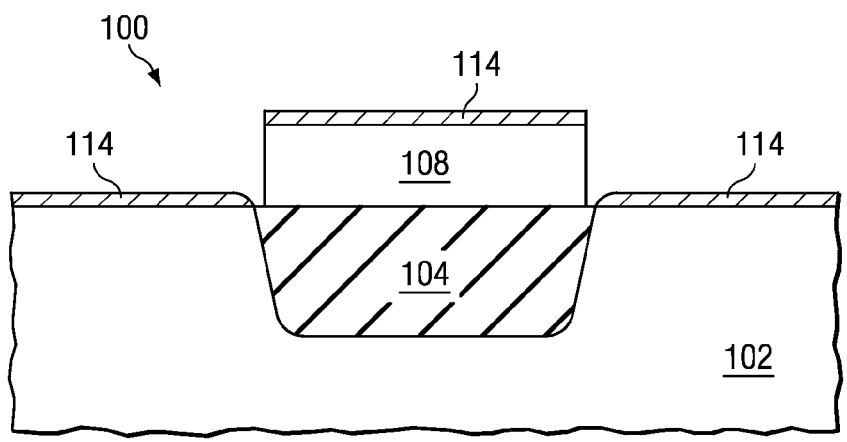
FIG. 5 shows a cross-sectional view of the semiconductor device, wherein the link and substrate are silicided.

Next, top portions of the link 108 and top portions of the substrate 102 proximate the link 108 are silicided, as shown in the cross-sectional view of FIG. 5. The silicide 114 may be formed by exposing the semiconductor device 100 to a gas comprising silane and/or a metal, such as Ni, Co, Ti, or W, as examples, although alternatively, other metals may be used to form the silicide 114. The silicide 114 may comprise a thickness of about 50 nm or less, for example, although alternatively, the silicide 114 may comprise other dimensions. The silicide 114 process may not result in silicide 114 being formed on the sidewalls of the link 108, as shown. In some embodiments, the silicide 114 may comprise NiSi, as an example. The silicide 114 may also comprise TiSi, CoSi, WSi, or other types of silicide, for example. The silicide 114 may also be formed using a deposition process, e.g., if the link 108 material comprises an insulator.

After the link 108 is silicided, the link includes the material 108 and the silicide 114; thus, the link 108 will now be referred to herein as a link 108/114. Likewise, after portions of the substrate 102 are silicided, the substrate includes the substrate 102 and the silicide 114; thus, the silicided portions of the substrate 102 will now be referred to herein as a substrate 102/114.

Figure 8:
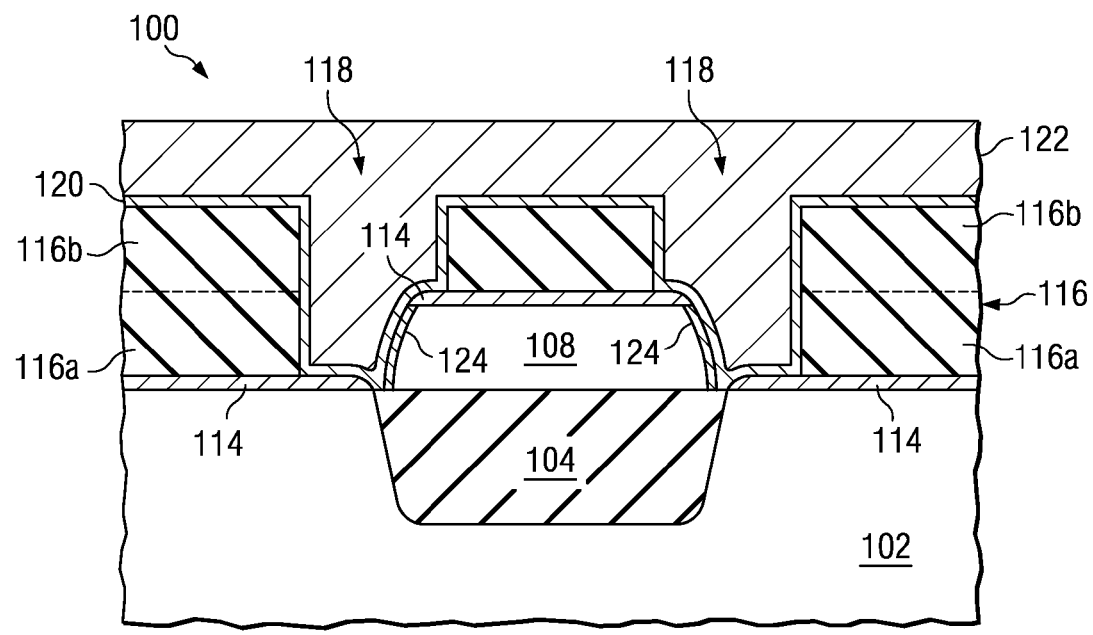
FIG. 8 shows a cross-sectional view of the semiconductor device after a conductive material is deposited over the insulating material, filling the patterns.
Figure 9:
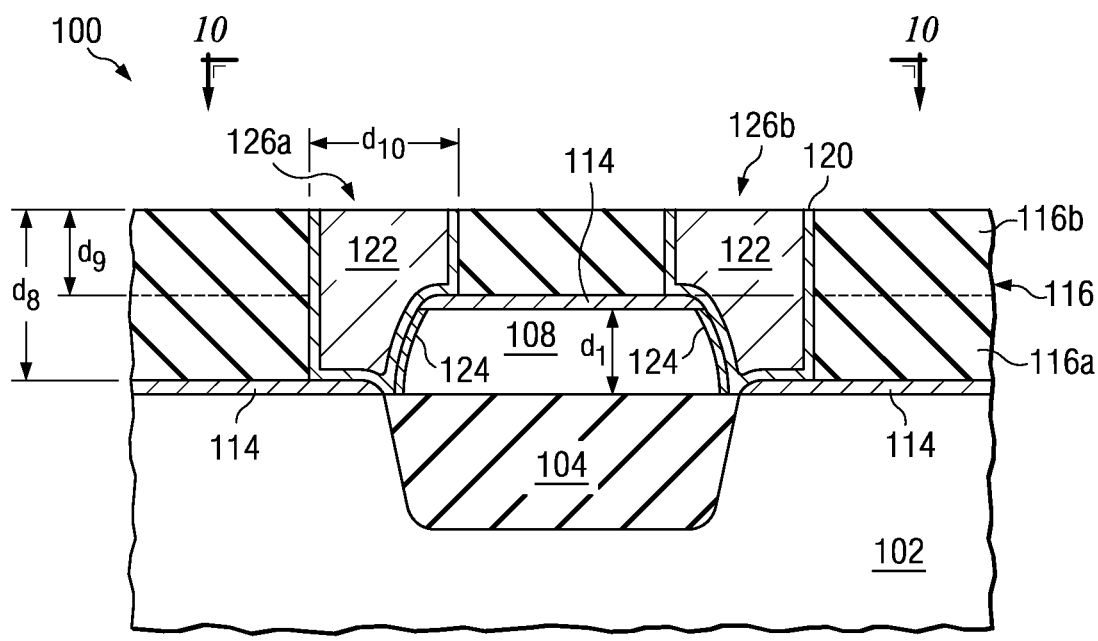
FIG. 9 shows a cross-sectional view of the semiconductor device after a chemical-mechanical polish (CMP) process that removes excess conductive material from the top surface of the insulating material, leaving at least one first contact and at least one second contact formed in the insulating material.
Figure 10:
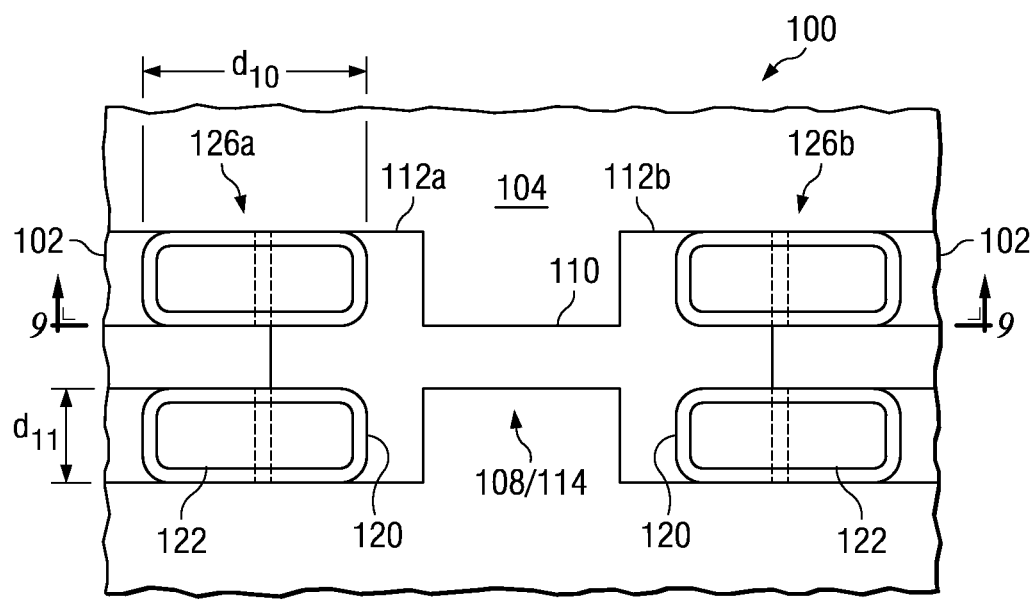
FIG. 10 shows a top view of the semiconductor device shown in FIG. 9, illustrating the substantially rectangular shape of the at least one first contact and the at least one second contact.

Next, substantially rectangular contacts 126a and 126b are formed over the ends 112a and 112b of the link 108/114, as shown in cross-sectional views in FIGS. 6 through 9 and in a top view in FIG. 10. The rectangular contacts 126a and 126b are also referred to herein as contacts, CARECs, or at least one first contact 126a and at least one second contact 126b, for example. The rectangular contacts 126a and 126b may be formed in the same manufacturing process steps used to form CARECs of the semiconductor device 100 elsewhere on the workpiece 102, e.g., in SRAM regions. The rectangular contacts 126a and 126b may be formed by a subtractive etch process in some embodiments, e.g., by forming a conductive material over the link 108/114 and substrate 102/114 and patterning the conductive material to form the rectangular contacts 126a and 126b. However, in other embodiments, the rectangular contacts 126a and 126b are formed using a damascene method. The patterns in the lithography mask (not shown) used to pattern the rectangular contacts may be rectangular, but when the contacts are actually patterned, the corners may be rounded, resulting in substantially rectangular-shaped contacts 126a and 126b, for example.

Figure 6:
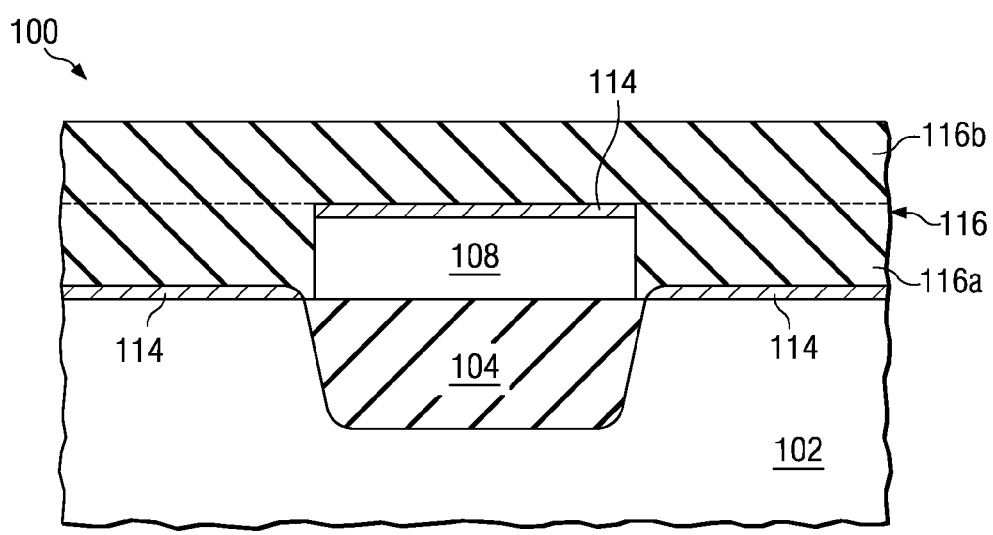
FIG. 6 shows an insulating material disposed over the link and substrate in a cross-sectional view.

In a damascene method, an insulating material 116 is formed over the link 108/114 and substrate 102/114, the insulating material 116 is patterned, and the patterned insulating material 116 is filled with a conductive material 120/122 to form the contacts 126a and 126b. For example, an insulating material 116 is formed over the silicided link 108/114 and substrate 102/114, as shown in FIG. 6. The insulating material 116 may be formed by depositing an oxide or other material, e.g., using a chemical vapor deposition (CVD) or other process. The insulating material 116 may comprise an oxide, a nitride, a low dielectric constant (k) material having a dielectric constant of less than 3.9, other insulators, or combinations or multiple layers thereof, for example. In some embodiments, the insulating material 116 comprises silicon dioxide, for example. The insulating material 116 extends over the top surface of the link 108 and comprises a greater height than the height or dimension $d_1$ (not shown in FIG. 6; see FIG. 3) of the link 108/114, as shown. The insulating material 116 may comprise a contact (CA) level inter-level dielectric (ILD) insulating material, for example. The insulating material 116 comprises a lower portion 116a and an upper portion 116b disposed over the lower portion 116a and the silicided link 108/114.

Figure 7:
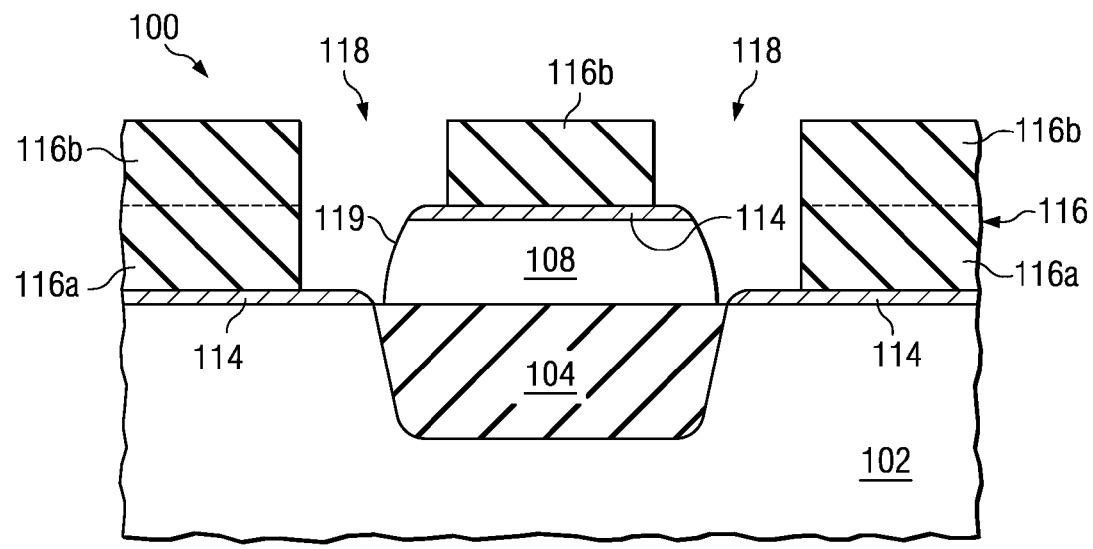
FIG. 7 illustrates a cross-sectional view of the semiconductor device after the insulating material is patterned with a pattern for at least one first contact and at least one second contact at ends of the link.

The insulating material 116 is patterned using lithography, as described for the patterning of the substrate 102 to form the isolation region 104, forming patterns 118 for the contacts 126a and 126b in the insulating material 116, as shown in a cross-sectional view in FIG. 7. Patterning the insulating material 116 leaves portions of the top surface of the silicided link 108/114, portions of the isolation region 104, and portions of the silicided substrate 102/114 exposed. Patterning the insulating material 116 may result in the rounding or sloping of the sidewalls 119 of the silicided link 108/114, due to the etch process used to pattern the insulating material 116, for example, as shown. If insulating sidewall spacers are present on sidewalls of the link 108/114, similar to the sidewall spacers 156 on gates 154 of transistors (not shown in FIG. 7; see FIG. 11), the sidewall spacers of the link 108/114 are also removed when patterning the insulating material 116, for example. Patterning the insulating material 116 comprises patterning the upper portion 116b proximate the top surface of the silicided link 108/114, and patterning both the upper portion 116b and the lower portion 116a proximate sidewalls 119 of the link 108/114 and the silicided workpiece 102/114 proximate the link 108/114.

The patterns 118 in the insulating material 116 are filled with a conductive material 120/122, as shown in a cross-sectional view in FIG. 8. For example, an optional liner 120 comprising a conductive material such as Ti, TiN, TaN, other materials, or multiple layers thereof, may be deposited over the patterned insulating material 116. The liner 120 may comprise a thickness of about 30 nm or less, for example. The liner 120 may comprise a first layer of Ti and a second layer of TiN disposed over the first layer of Ti, as an example. Alternatively, the liner 120 may comprise other materials and dimensions, for example. The liner 120 lines the top surfaces and sidewalls of the insulating material 116, portions of the silicide 114 of the link 108/114, portions of the silicide 114 of the substrate 102/114, and portions of the isolation region 104 disposed between the substrate 102/114 and the link 108/114.

In some embodiments, forming the optional liner 120 may cause the formation of an optional silicide 124 on sidewalls of the link 108/114, as shown in FIG. 8. For example, if the liner 120 comprises Ti and the material 108 of the link 108/114 comprises Si, then a silicide 124 comprising TiSi may be formed on the sidewalls of the link 108/114. The silicide 124 may comprise a thickness of about 10 nm or less, for example. Alternatively, the optional silicide 124 may comprise other materials and dimensions, for example.

If the liner 120 does not comprise Ti, the silicide 124 may not be formed, for example. As one example, the liner 120 may comprise TaN, and conductive material 122 (to be described further herein) may comprise Cu. In such an embodiment, silicide 124 would not be formed, for example. The silicide 124 may also not be formed if other materials are used for the liner 120 and/or conductive material 122, for example.

A conductive material 122 is then formed over the optional liner 120, as shown in FIG. 8. The conductive material 122 may comprise a material such as W, although alternatively, the conductive material 122 may comprise other materials, such as Cu, Al, or alloys or combinations thereof with other metals.

The conductive material 120/122 of the first and second contacts 126a and 126b may comprise a material or materials deposited to form other contacts for other devices of the semiconductor device 100, for example, such as contacts 160 and 162 shown in FIG. 11. In some embodiments, the conductive material 120/122 formed in the insulating material 116 comprises a contact (CA) layer of a semiconductor device, e.g., formed after a front-end of the line (FEOL) process. The CA layer may comprise a first metallization layer of a back-end of the line (BEOL) process in some embodiments, for example.

Excess conductive material 120/122 is then removed from over the top surface of the insulating material 116 using an etch process and/or a CMP process, as shown in FIG. 9 in a cross-sectional view, leaving first and second contacts 126a and 126b formed in the insulating material 116. A top view of the semiconductor device 100 (without the insulating material 116) in FIG. 9 at 10-10 at this stage of the manufacturing process is shown in FIG. 10. The first and second contacts 126a and 126b may comprise W, Cu, Al, Ti, TiN, TaN, other conductive materials, or multiple layers or liners thereof in some embodiments, for example.

Two first contacts 126a are shown in the top view in this embodiment proximate the first end 112a of the link 108/114, and two second contacts 126b are shown proximate the second end 112b of the link 108/114. Alternatively, only one first contact 126a and one second contact 126b may be formed. In other embodiments, three or more first contacts 126a and second contacts 126b may be formed.

The first and second contacts 126a and 126b comprise a height or dimension $d_9$ proximate a first side of the first and second contacts 126a and 126b. Dimension $d_9$ may comprise substantially the thickness of the upper portion 116b of the insulating material 116. The first and second contacts 126a and 126b comprise a height or dimension $d_8$ proximate a second side of the contacts 126a and 126b, wherein the second side of the contacts 126a and 126b is opposite the first side of the contacts 126a and 126b. Dimension $d_8$ may comprise substantially the thickness of the insulating material 116, e.g., the lower portion 116a and the upper portion 116b of the insulating material 116. Dimension $d_8$ may be greater than $d_9$ by an amount substantially equal to the thickness of the lower portion 116a of the insulating material 116, for example.

The first side of the first and second contacts 126a and 126b comprises a side that is adjacent, coupled to, and in electrical contact with the top surface of the link 108/114, e.g., adjacent a portion of the silicide 114 of the link 108/114. The second side of the first and second contacts 126a and 126b comprises a side that is adjacent, coupled to, and in electrical contact with the top surface of the substrate 102/114, e.g., adjacent a portion of the substrate 102/114 covered with silicide 114. A portion of the first and second contacts 126a and 126b is coupled to the substrate 102/114, as shown. A portion of the first and second contacts 126a and 126b is also coupled to the sidewalls 119 of the link 108/114.

The dimension $d_8$ is also referred to herein as a third height, and dimension $d_9$ is also referred to herein as a second height, e.g., in the claims. In some embodiments, dimension $d_8$ is greater than the second height or dimension $d_9$ of the contacts 126a and 126b, and dimension $d_8$ is also greater than the first height or dimension $d_1$ of the link 108/114, for example. Dimension $d_8$ may be substantially equal to the total or summation of dimensions $d_1$ and $d_9$, for example. Some areas or portions of the first and second contacts 126a and 126b may have a height that is greater than the third height or dimension $d_8$ by about the thickness of about the silicide 114, e.g., in areas of the contacts 126a and 126b disposed over the isolation regions 104 where the silicide 114 is not present.

The first and second contacts 126a and 126b comprise a substantially rectangular shape in the top view of the semiconductor device 100, comprising a length or dimension $d_{10}$ on a first edge of about 300 nm or less and a width or dimension $d_{11}$ on a second edge of about 100 nm or less, as examples. Alternatively, dimensions $d_{10}$ and $d_{11}$ may comprise other dimensions or values, for example. Dimension $d_{11}$ may comprise a minimum feature size of the semiconductor device 100, and dimension $d_{10}$ may comprise about 2× to 3× the minimum feature size of the semiconductor device 100 in some embodiments, for example.

The first and second contacts 126a and 126b may comprise CARECs comprising substantially the same shape and size as CARECs formed in other regions of the semiconductor device 100. For example, CARECs may be formed in SRAM regions of the semiconductor device 100, not shown, wherein the CARECs are used to make electrical contact to portions of the SRAM devices and are also used to connect or couple together portions of individual SRAM devices. For example, CARECs may be used to make a connection between two levels of the semiconductor device 100, and also to connect silicide from a top of a polysilicon gate to a silicide on the substrate 102. The CARECs of the SRAM devices (not shown) are also referred to herein as at least one third contact, e.g., in the claims, to distinguish between the first and second contacts 126a and 126b.

Advantageously, CARECs that are rectangular and make electrical contact to underlying devices having two different heights, such as dimensions $d_8$ and dg of the first and second contacts 126a and 126b, may already be designed into the semiconductor device 100 manufacturing process flow, and the first and second contacts 126a and 126b of the programmable devices 140 described herein are advantageously easily implemented into the semiconductor device 100 design, in some embodiments. Thus, the introduction of a new species of contact into the manufacturing process flow for the semiconductor device 100 is avoided, which saves engineering time and money for integrating a new species of contact and avoids reliability problems, as examples.

The first and second contacts 126a and 126b are coupled to a first end 112a and a second end 112b of the link 108/114, respectively. For example, first contacts 126a are coupled to the first end 112a (see FIG. 10), e.g., the left end of the link 108/114 in FIG. 9. Contacts 126a comprise first contacts that are adjacent a portion of a top surface of the link 108/114 and are also adjacent at least one sidewall of the link 108/114 and the substrate 102/114. Second contacts 126b are coupled to the second end 112b, e.g., the right end of the link 108/114. Contacts 126b comprise second contacts that are adjacent a portion of a top surface of the link 108/114 and are also adjacent at least one sidewall of the link 108/114 and the substrate 102/114.

Next, a first conductive line 130a is formed over the first contact 126a, and a second conductive line 130b is formed over the second contact 126b, as shown in FIG. 11. The first conductive line 130a and the second conductive line 130b may be formed in a conductive line layer of the semiconductor device 100. The conductive line layer may comprise a metallization layer M1 of the semiconductor device 100, for example. The conductive lines 130a and 130b may be formed using a damascene process, as described for the contacts 126a and 126b, for example. Alternatively, the conductive lines 130a and 130b may be formed using a subtractive etch process, by depositing a conductive material, patterning the conductive material using an etch process, and forming an insulating material 128 between the patterned conductive lines 130a and 130b. If the conductive lines 130a and 130b comprise Al, for example, a subtractive etch process may be used.

In a damascene process, which may be used if the conductive lines 130a and 130b comprise Cu, for example, an insulating material 128 that may comprise similar materials and dimensions described for insulating material 116 is formed over the first insulating material 116 and the contacts 126a and 126b. The insulating material 128 is patterned with a pattern for the conductive lines 130a and 130b, and a conductive material 132/134 is formed over the insulating material 128 to fill the patterns. The conductive material 132/134 may comprise a liner 132 comprising a barrier layer, seed layer, or other conductive liner materials, and the conductive fill material 134 may comprise Cu, Al, or alloys or combinations thereof, as examples. Alternatively, the conductive material 132/134 may comprise other materials. Excess conductive material 132/134 is then removed from over the top surface of the insulating material 128 using an etch and/or CMP process, for example, leaving the conductive lines 130a and 130b formed in the insulating material 128. Other conductive lines 164 (see region 150) may simultaneously be formed in other regions of the semiconductor device 100 in the same conductive line layer M1 that the conductive lines 130a and 130b are formed in, for example.

FIG. 11 also shows another region 150 of the semiconductor device 100 elsewhere on the workpiece 102, which may be proximate or spaced apart from the fuse 140, in an embodiment of the present invention where the programmable device or fuse 140 may be implemented in an SRAM application, as an example. Transistors comprising a gate dielectric 152 formed over the workpiece 102 and a gate 154 disposed over the gate dielectric are formed in regions 150. The transistors include sidewall spacers 156 formed on sidewalls of the gate 154 and gate dielectric 152. Source and drain regions 158 are formed in the workpiece 102 proximate the sidewall spacers of the transistor. The gate 154 and source and drain regions 158 of the transistors may comprise a silicide 114 at a top surface thereof, as shown.

Contacts 160 make electrical connection between conductive lines 164 in insulating material 128 and the source or drain regions 158 of the transistor. Contacts 160 comprise a first species of contacts that extend completely through the insulating material 116, for example. Contacts 162 make electrical connection between conductive lines 164 in insulating material 128 and the gate 154 of the transistor. Contacts 162 comprise a second species of contacts that extend through the upper portion 116b of the insulating material 116, for example. CARECs comprise a third species of contacts that may also be formed in region 150, not shown. The CARECs in region 150 comprise a similar size and shape as first and second contacts 126a and 126b of the fuse 140, comprising a portion that extends completely through the insulating material 116 and another portion that extends only through the upper portion 116b of the insulating material 116, for example. Thus, the novel fuse 140 of embodiments of the present invention advantageously utilizes an existing species of contacts, in accordance with some embodiments of the present invention, e.g., when implemented in an SRAM device or applications, where CARECs are frequently used.

A top view of the semiconductor device 100 including the programmable device 140 is shown in FIG. 12. The conductive lines 130a and 130b reside over and are coupled to the first and second contacts 126a and 126b, respectively, and make electrical contact to the first and second contacts 126a and 126b, respectively.

The conductive lines 130a and 130b, first and second contacts 126a and 126b, and link 108/114 comprise a programmable device or fuse 140. A resistance of the link 108/114 is alterable by applying a voltage, causing a current to flow from the at least one first contact 126a through the link 108/114 to the at least one second contact 126b. For example, the silicide 114 of the link 108/114 makes the link 108/114 more conductive and decreases the resistance of the link 108/114. Alternatively, if the link 108 comprises an insulator, the silicide 114 may provide substantially all of the conductivity for the link 108/114, for example.

If a current i is applied through the structure that has a great enough magnitude, electromigration is caused of the silicide 114 of the link 108, e.g., proximate the first contact 126a, causing a discontinuity or break 142 in the silicide 114 of the link 108/114, as shown in the cross-sectional view of FIG. 11 and also in the top view of FIG. 12. The discontinuity 142 comprises a hole in the silicide 114 that is formed by electromigration of the silicide 114. The discontinuity 142 may occur on the link 108/114 proximate or beneath the at least one first contact 126a, for example. The discontinuity or break 142 in the silicide 114 of the link 108/114 causes an increase in the resistance of the link 108/114, e.g., increasing the resistance of the programmable device 140 and programming the device 140. Thus, the resistance of the link 108/114 is alterable by electromigration of a material (e.g., the silicide 114) of the link 108/114 when the current is applied.

The larger the break or discontinuity 142 of the link 108/114 after programming, the greater the resistance of the fuse 140 will be, providing an increase in the resistance difference between the programmed and unprogrammed states of the fuse 140. In accordance with some embodiments of the invention, causing the current i to flow alters the resistance of the link 108/114 significantly, so that the resistance may subsequently be sensed to determine a programming state of the programmable device 140, for example.

The voltage that causes the current i to flow and program the fuse 140 may be applied at the conductive lines 130a and 130b. The voltage that causes the current i or a portion thereof to flow may optionally also may be applied at the substrate 102. For example, a first portion of a current $i_1$ may be applied at the first conductive line 130a and a second portion of a current $i_2$ may be applied at the substrate 102, as shown in FIG. 11. Currents $i_1$ and $i_2$ pass through the first contact 126a, the link 108/114, and the second contact 126b. The total current i in the first contact 126a, the link 108/114, and the second contact 126b comprises a current i that is a summation of the currents $i_1$ and $i_2$. The current i then passes to the second conductive line 130b, as shown. The first portion of the current $i_1$ may comprise about 80% of the current i and the second portion of the current $i_2$ may comprise about 20% of the current i in some embodiments, for example, although alternatively, the current i may be applied in different percentages through the programmable device 140.

To cause the current i to flow and program the device 140, a voltage difference is applied across the first conductive line 130a and/or the substrate 102 and the second conductive line 130b. For example, a positive voltage, such as about 1.5 V or greater, may be applied to the first conductive line 130a and/or the substrate 102. A lower voltage, such as about 0 V, may be applied to the second conductive line 130b. Alternatively, other voltage levels and voltage differences may be used to cause the current i to flow and program the device 140, for example.

A cap layer 136 comprising an insulating material may be formed over the conductive lines 130 and 130b and insulating material 128, as shown in FIG. 11. Additional metallization layers may be formed over the barrier layer 136, e.g., one or more via layers and conductive line layers may be formed over the semiconductor device 100 and connected to the conductive lines 130a or 130b, substrate 102/114, or other devices of the integrated circuit to complete the fabrication process, not shown.

In the embodiment shown in FIGS. 1 through 12, the contacts 126a and 126b comprise two first contacts 126a and two second contacts 126b. The first conductive line 130a is sufficiently large enough to cover and make contact with both of the first contacts 126a, as shown in the top view in FIG. 12. Likewise, the second conductive line 130b is sufficiently large enough to cover and make contact with both of the second contacts 126b. Alternatively, three or more first contacts 126a and three or more second contacts 126b may be included in the programmable device 140, not shown in the figures.

In other embodiments, a programmable device 240 may include only one first contact 226a and one second contact 226b, as shown in a top view in FIG. 13. Like numerals are used for the various elements that were used to describe FIGS. 1 through 12, and to avoid repetition, each reference number shown in FIG. 13 is not described again in detail herein. Rather, similar materials x02, x04, x06, x08, etc. . . . are preferably used for the various material layers shown as were used to describe for FIGS. 1 through 12, where x=1 in FIGS. 1 through 12 and x=2 in FIG. 13. The first and second conductive lines 226a and 226b may be made smaller in these embodiments, comprising a width sufficient to cover the single first and second contacts 226a and 226b, as shown. The width of the first and second conductive lines 226a and 226b may be slightly greater than the width of the central region 210 of the link 208/214 in these embodiments, or the width of the first and second conductive lines 226a and 226b may be substantially the same as the width of the central region 210 of the link 208/214, for example.

Only one fuse 140 and 240 is shown in the figures; however, a plurality of fuses 140 and 240 may be formed simultaneously across the surface of the semiconductor device 100 and 200 in some applications, not shown. Tens, hundreds, or thousands of programmable devices 140 and 240 may be formed across a surface of a semiconductor device 100 and 200, for example.

Embodiments of the present invention include methods of manufacturing semiconductor devices 100 and 200 and semiconductor devices 100, programmable device 140 and 240, and fuses 140 and 240 manufactured using the methods described herein. Embodiments of the present invention also include methods of programming semiconductor devices 100 and 200.

For example, in one embodiment, a method of programming a semiconductor device 100 or 200 includes providing a programmable device 140 or 240, the programmable device 140 or 240 comprising a link 108/114 or 208/214. The programmable device 140 or 240 includes at least one first contact 126a or 226a coupled to a first end 112a or 212a of the link 108/114 or 208/214, the at least one first contact 126a or 226a being adjacent a portion of a top surface of the link 108/114 or 208/214 and at least one sidewall of the link 108/114 or 208/214. The programmable device 140 or 240 includes at least one second contact 126b or 226b coupled to a second end 112b or 212b of the link 108/114 or 208/214, the at least one second contact 126b or 226b being adjacent a portion of the top surface of the link 108/114 or 208/214 and at least one sidewall of the link 108/114 or 208/214. The method of programming the semiconductor device 100 or 200 includes applying a current i from the at least one first contact 126a or 226a through the link 108/114 or 208/214 to the at least one second contact 126b or 226b. Applying the current i alters a resistance of the link 108/114 or 208/214 of the programmable device 140 or 240.

Applying the voltage that causes the current i to flow through the link 108/114 or 208/214 may comprise applying a voltage of about 1.5 V or greater, for example, although alternatively, other voltage levels may be used. Applying the voltage may cause a current i of about 5 mA or greater to flow, for example, although alternatively, other levels of current i may also be used. In some embodiments, the programming current i may comprise about 5 to 10 mA, as an example. The amount of current i required to program the fuse 140 or 240 may vary as a function of the materials or dimensions of the link 108/114 or 208/214 and/or number of contacts 126a or 226a and 126b or 226b used, for example.

Before programming, the programmable devices 140 or 240 may comprise a resistance of about 1,000Ω or less, as an example. In the unprogrammed state with the silicide 114 of the link 108/114 intact, the resistance of the devices 140 or 240 may be about 100Ω, for example. After programming, the programmable devices 140 or 240 may comprise a resistance of about 10,000Ω or greater, for example. In some embodiments, after the silicide 114 of the link 108/114 is disturbed, forming the discontinuity 142, the resistance of the programmable devices 140 or 240 may be about 50,000Ω, or about 10,000 to 100,000Ω, for example. Alternatively, the resistance values of the programmable devices 140 or 240 may comprise other values, wherein the programmed and unprogrammed states are detectable by a variation in a measured resistance of the fuses 140 or 240.

The novel fuses 140 and 240 described herein provide flexibility in programming and sensing the fuses 140 and 240. For example, the fuses 140 and 240 may be programmed or sensed using the workpiece or substrate 102 or 202 or the first conductive lines 130a or 230a. Advantageously, because the substrate 102 or 202 may be used to sense the programmed state or resistance, more sensitivity may be provided, because high leakage currents of other devices that may be connected to the conductive lines 130a or 130b are avoided.

The programming of the fuses 140 or 240 may be performed before singulation, after a wafer test, after a burn-in test, after singulation, before packaging, after packaging, or during or after use in an end application, as examples, although alternatively, the novel fuses 140 or 240 may be programmed at different times.

In embodiments wherein a portion of the at least one first contact 126a or 226a is coupled to the substrate 102/114, applying the voltage that causes the programming current i during the programming process may comprise applying at least a portion $i_2$ of the current i to the substrate 102/114.

Embodiments of the present invention are beneficial in many applications. For examples, the programmable devices 140 and 240 may be used in memory arrays such as SRAM cells, to disable certain areas of the memory array. Redundant areas of circuitry, such as memory cells in a memory array may be enabled or disabled by programming the fuses 140 and 240, for example. The fuses 140 and 240 may be used to program optional features of an electronic device, such as a cell phone or MP3 player. Another example of an application in which the fuses 140 and 240 may be implemented is in EID of the integrated circuit 100 containing the fuses 140 and 240. Alternatively, embodiments of the present invention may be implemented in other applications.

Embodiments of the present invention achieve technical advantages by providing novel structures for electrically programmable fuses 140 and 240 and novel methods of manufacture thereof. The link 108/114 and 208/214 may be formed at the same time, e.g., using the same lithography mask and manufacturing processing steps, that gate of transistors or memory devices are formed, such as gates 154 shown in FIG. 11. The rectangular contacts 126a, 126b, 226a, and 226b may be formed at the same time, using the same lithography mask and manufacturing processing steps, that CARECs of other memory devices such as SRAMs are formed. The rectangular contacts 126a, 126b, 226a, and 226b may be formed using the same lithography step and etch process that contacts 160, 162, and CARECs are formed in region 150 of the semiconductor device 100, for example. The conductive lines 130a, 130b, 230a, and 230b may be formed at the same time, using the same lithography mask and manufacturing processing steps, that other conductive lines 164 in region 150 of the semiconductor device 100 and 200 are formed. Thus, no additional lithography masks or processing steps may be required to manufacture the novel fuses 140 and 240.

Because contacts 126a, 126b, 226a, and 226b may have a similar shape and may be formed using a same processing step as existing CARECs in other regions of the semiconductor device 100 and 200 in some embodiments, introducing an additional species or type of contact into the manufacturing process flow is avoided. Thus, additional maintenance efforts to ensure reliability of an additional size or type of contact in the manufacturing process flow are advantageously not required.

The rectangular contacts 126a, 126b, 226a, and 226b are larger than a minimum feature size contact or via, resulting in contacts 126a, 126b, 226a, and 226b that have a high current carrying capability. The increased current carrying capability of the contacts 126a and 226a enables them to reach a higher temperature during programming. Thus, the discontinuity or break 142 that forms below the contacts 126a and 226a from the high current used to program the fuses 140 and 240 is larger, which improves the reliability of the fuses 140 and 240 and increases the measurable resistance difference between programmed and unprogrammed fuses 140 and 240. Furthermore, the larger rectangular contacts 126a, 126b, 226a, and 226b also have a large cooling access and stay cool during programming, preventing reliability issues due to overheating.

Because portions of the contacts 126a, 126b, 226a, and 226b are coupled to the substrate 102/114, at least a portion $i_2$ of the current i used to program the fuses 140 and 240 may also be applied through the substrate 102/114. Thus, double current routing capability is provided by the novel fuse structures 140 and 240, through the substrate 102/114 or conductive lines 130a or 230a.

Different routing may be implemented in the semiconductor device 100 or 200 for sensing and programming, e.g., by routing to either the substrate 102/114 or the conductive lines 130a, 130b, 230a, and 230b, providing flexibility in programming and/or sensing the programmed state of the fuses 140 and 240. Additional routing opportunities for programming and sensing are provided by the novel fuse 140 and 240 designs described herein.

The optional routing of current for sensing and programming is advantageous in applications where large devices such as transistors may be coupled to the conductive lines 130a and 130b, for example. Some transistors have a large amount of leakage current which comprise an amount of current of a magnitude in the same range as the magnitude of current used for sensing the fuses 140 or 240 to detect their programming state. In accordance with embodiments of the present invention, because the novel first and second contacts 126a, 126b, 226a, and 226b comprise CARECs that contact the substrate 102 and 202 and also the first conductive lines 130a and 230a, the first conductive lines 130a and 230a may be used for programming, and the substrate 102 and 202 may be used for sensing, for example, so that the sensing operation is not deleteriously affected by any leakage current that may be present on the conductive lines 130a, 130b, 230a, or 230b, for example.

The optional silicide 124 that may form on the sidewall of the link 108 during the formation of the contacts 126a and 126b provides an additional contact or connection of the contacts 126a and 126b to the polysilicon of the link 108. The silicide 124 provides a large interface area, which continues to provide electrical connection and contact of the contacts 126a and 126b to the link 108/114 in the event that the discontinuity or break region 142 becomes excessively enlarged, in which case the silicide 114 may be demigrated below the rectangular contacts 126a during programming, which may end the programming sooner than intended or cause excessive heating. Thus, the optional silicide 124 provides an increased process window, for example.

The positioning of the contacts 126a, 126b, 226a, and 226b with respect to the link 108/114 or 208/214 advantageously provides current dividing and equal distance to the migration area, e.g., proximate the discontinuity 142 region.

The design of the fuses 140 and 240 advantageously requires a small amount of area on an integrated circuit. The thin link 108/114 and 208/214 that may comprise a width $d_5$ of a minimum feature size of the semiconductor device 100 advantageously provides a small silicide reservoir for electromigration. The area ($d_4 \times d_7$) shown in FIG. 4 of the first end 112a and second end 112b of the fuse 140 may be selected and designed to be as small as possible, in order to improve reliability. For example, minimizing the area ($d_4 \times d_7$) of the first end 112a and second end 112b of the fuse 140 prevents the presence of an excessive amount of silicide 114 during the electromigration of the silicide 114 during programming of the fuse 140, avoiding the discontinuity region 142 being re-filled in with excess silicide 114.

Furthermore, because the first and second contacts 126a, 126b, 226a, and 226b comprise larger rectangular contacts or CARECs, a large amount of current may be used during programming, for example. The higher current that may be used for programming may result in larger discontinuity regions 142, for example, leading to a higher measurable resistance of programmed fuses 140, advantageously.

The novel fuses 140 and 240 are easily and inexpensively implementable in manufacturing process flows for semiconductor devices 100. For example, the novel fuses 140 and 240 described herein may easily be implemented into existing manufacturing process flows, lithography mask designs, and lithography tools and systems, with few or no additional processing steps being required for implementation of the invention.

Embodiments of the present invention use well-established semiconductor device manufacturing processes and design species, namely, for CARECs, to form the first and second contacts 126a, 126b, 226a, and 226b, to produce fuses 140 and 240 that have a higher current carrying capability, without requiring the use of an additional contact species.

Embodiments of the invention may be implemented in semiconductor applications such as transistors, memory devices, logic devices, mixed signal devices, and other applications, as examples. Embodiments of the present invention are particularly advantageous when used in semiconductor devices having SRAM devices in some regions, because a process for a CAREC contacts is already be implemented in most SRAM device designs. Alternatively, the novel fuses 140 and 240 may also be implemented in other types of memory devices, such as dynamic random access memory (DRAM) devices, flash memory, or other types of devices, such as logic, analog, mixed signal, or other applications.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A programmable device comprising:
   a silicide layer directly disposed on a region of a substrate;
   a link comprising a semiconductor or insulator material and a layer of silicide material, wherein the layer of silicide material is disposed over the semiconductor or insulator material, wherein the link is disposed on the substrate and comprises a first sidewall and an opposite second sidewall, and wherein the first sidewall and the second sidewall comprise a silicide sidewall layer covering sidewalls of the semiconductor or insulator material;
   a first contact coupled to a first end of the link, wherein the first contact is disposed on and physically contacts the first sidewall of the link, wherein the first contact is disposed on and physically contacts a portion of the layer of silicide material of the link, and wherein the first contact is disposed directly on and physically contacts a first portion of the silicide layer;
   a second contact coupled to a second end of the link, the second contact disposed on the second sidewall of the link;

a third contact coupled to the first end of the link and disposed adjacent the first contact, the third contact disposed on the first sidewall of the link and disposed directly on and physically contacting the first portion of the silicide layer;

a fourth contact coupled to the second end of the link and disposed adjacent the third contact, the fourth contact disposed on the second sidewall of the link; and a first conductive line coupled to the first contact and a second conductive line coupled to the second contact, wherein the first conductive line is disposed in a metallization level immediately above the first contact, and wherein the first conductive line physically contacts a top surface of the first contact.

2. The programmable device according to claim 1, wherein a resistance of the link is alterable by applying a current from the first contact through the link to the second contact.

3. The programmable device according to claim 2, wherein the resistance of the link is alterable by electromigration of a material of the link.

4. The programmable device according to claim 1, wherein the first contact and the second contact comprise substantially rectangular shaped contacts in a top view of the programmable device.

5. The programmable device according to claim 4, wherein the first contact and the second contact comprise a length on a first edge of about 300 nm or less and a width on a second edge of about 100 nm or less in the top view of the programmable device.

6. The programmable device according to claim 1, wherein the layer of silicide material comprises NiSi, TiSi, CoSi or WSi.

7. The programmable device according to claim 1, further comprising the second contact disposed directly on a second portion of the silicide layer.

8. A fuse comprising:
a silicide layer directly disposed on a region of a substrate;
an insulating layer disposed over the substrate;
a link comprising a semiconductor material and a layer of silicide material, wherein the link is disposed in the insulating layer, wherein the layer of silicide material is disposed over the semiconductor material, and wherein the link is disposed on the substrate, wherein the link comprises a first sidewall and an opposite second sidewall, and wherein the first sidewall and the second sidewall comprise a silicide sidewall layer covering sidewalls of the semiconductor material;
a first conductive line proximate a first end of the link;
a first contact disposed in the insulating layer, the first contact coupled between the first end of the link and the first conductive line, the first contact disposed on and physically contacting the first sidewall of the link and disposed directly on and physically contacting a first portion of the silicide layer, wherein the first contact comprises a first conductive liner, wherein the first conductive line is disposed in a metallization level immediately above the first contact, and wherein the first conductive line physically contacts a top surface of the first contact;
a second conductive line proximate a second end of the link; and
a second contact disposed in the insulating layer, the second contact coupled between the second end of the link and the second conductive line, the second contact disposed on the second sidewall of the link and disposed directly on and physically contacting a second portion of the silicide layer, wherein the second contact comprises a second conductive liner.

9. The fuse according to claim 8, wherein the first contact and the second contact comprise W, Cu, Al, Ti, TiN, or TaN.

10. The fuse according to claim 8, wherein the link comprises a first height, wherein the first contact and the second contact comprise a second height proximate a first side of the first contact and the second contact, wherein the first contact and the second contact comprise a third height proximate a second side of the first contact and the second contact, the third height being greater than the second height and the first height.

11. The fuse according to claim 8, wherein the layer of silicide material of the link is alterable by applying a voltage across the first conductive line or the substrate and the second conductive line, causing a current to flow from the first conductive line or the substrate through the first contact, the link, and the second contact to the second conductive line.

12. The fuse according to claim 11, wherein a programming state of the fuse is detectable by applying the voltage across the first conductive line or the substrate and the second conductive line.

13. The fuse according to claim 8, wherein the link is disposed in a lower portion of the insulating layer disposed over the substrate, wherein the first contact and the second contact are disposed in the lower portion of the insulating layer and also in an upper portion of the insulating layer, and wherein the first conductive line and the second conductive line are disposed in a conductive line layer disposed over the insulating layer.

14. The fuse according to claim 8, wherein the layer of silicide material comprises NiSi, TiSi, CoSi or WSi.

15. A programmable device comprising:
a silicide layer directly disposed on a region of a substrate;
an insulating layer disposed over the substrate;
a link comprising a semiconductor or insulator material and a conductive material, wherein the link is disposed in the insulating layer, wherein the conductive material is disposed over the semiconductor or insulator material, wherein the link is disposed on the substrate, wherein the link comprises a first sidewall and an opposite second sidewall, and wherein the first sidewall and the second sidewall comprise a silicide sidewall layer covering sidewalls of the semiconductor or insulator material;
a first contact disposed in a first opening in the insulating layer, the first contact coupled to a first end of the link, the first contact disposed on and physically contacting the first sidewall of the link, and disposed directly on and physically contacting a first portion of the silicide layer, wherein the first contact comprises a first conductive liner;
a second contact disposed in a second opening in the insulating layer, the second contact coupled to a second end of the link, the second contact disposed on the second sidewall of the link;
a third contact disposed in a third opening in the insulating layer, the third contact coupled to the first end of the link and disposed adjacent the first contact, the third contact disposed on the first sidewall of the link and disposed directly on and physically contacting the first portion of the silicide layer;
a fourth contact disposed in a fourth opening in the insulating layer, the fourth contact coupled to the second end of the link and disposed adjacent the second contact, the fourth contact disposed on the second sidewall of the link; and a first conductive line coupled to the first contact and a second conductive line coupled to the second contact, the first conductive line disposed in a metallization level immediately above the first contact, the first conductive line physically contacting a top surface of the first contact.

16. The programmable device according to claim 15, further comprising the first contact disposed on a first portion of a top surface of the link, and the second contact disposed on a second portion of the top surface of the link.

17. The programmable device according to claim 15, wherein the first contact and the second contact comprise substantially rectangular shaped contacts in a top view of the programmable device.

18. The programmable device according to claim 15, wherein the first end of the link and the second end of the link are wider than a central region of the link.

19. The programmable device according to claim 15, wherein the programmable device is located directly on a shallow trench isolation region.

20. The programmable device according to claim 15, wherein the first contact and the second contact comprise a length on a first edge of about 300nm or less and a width on a second edge of about 100nm or less in a top view of the programmable device.

21. The programmable device according to claim 15, wherein the first contact and the second contact comprise W, Cu, Al, Ti, TiN, or TaN.

22. The programmable device according to claim 15, wherein the conductive material comprises NiSi, TiSi, CoSi or WSi.

23. The programmable device according to claim 15, further comprising the second contact disposed directly on a second portion of the silicide layer, wherein the second contact comprises a second conductive liner.

24. A programmable device comprising:
a silicide layer directly disposed on a region of a substrate;
an insulating layer disposed over the substrate;
a semiconductor material link disposed on the substrate and disposed in the insulating layer, wherein the semiconductor material link comprises a first sidewall and an opposite second sidewall, and
wherein the first sidewall and the second sidewall are covered by a silicide sidewall layer;
a silicide material link is disposed in the insulating layer, wherein the silicide material link is directly disposed over the semiconductor material link, and wherein the silicide material link consists essentially of NiSi, consists essentially of TiSi, consists essentially of CoSi or consists essentially of WSi;
a first contact coupled to a first end of the semiconductor material link and the silicide material link, the first contact abutting a first portion of a top surface of the silicide material link, the silicide sidewall layer covering the first sidewall of the semiconductor material link and a first sidewall of the silicide material link, and disposed directly on and physically contacting a first portion of the silicide layer, wherein the first contact comprises a first conductive liner, wherein the first contact is a first rectangular contact via disposed in the insulating layer;
a metal line disposed in a metallization level above the first contact, the metal line physically contacting a top surface of the first contact; and
a second contact coupled to a second end of the semiconductor material link and the silicide material link, the second contact abutting a second portion of the top surface of the silicide material link, the silicide sidewall layer covering the second sidewall of the semiconductor material link and a second sidewall of the silicide material link, and disposed directly on and physically contacting a second portion of the silicide layer, wherein the second contact is a second rectangular contact via disposed in the insulating layer, and wherein the second contact comprises a second conductive liner.

25. The programmable device according to claim 24, wherein the first contact and the second contact comprise W, Cu, Al, Ti, TiN, or TaN.

26. The programmable device according to claim 24, wherein the first end of the semiconductor material link and the silicide material link comprise a first area of less than about 500 nm×about 500 nm, and wherein the second end of the semiconductor material link and the silicide material link comprise a second area of less than about 500 nm×about 500 nm.

27. The programmable device according to claim 24, wherein the first contact and the second contact comprise substantially rectangular shaped contacts in a top view of the programmable device.

* * * * *